(12) United States Patent
Chiang et al.

(10) Patent No.: US 7,844,026 B2
(45) Date of Patent: Nov. 30, 2010

(54) SHIFT REGISTER WITH SIX TRANSISTORS AND LIQUID CRYSTAL DISPLAY USING THE SAME

(75) Inventors: Chien-Hsueh Chiang, Miao-Li (TW); Sz-Hsiao Chen, Miao-Li (TW)

(73) Assignee: Chimei Innolux Corporation, Miao-Li County (TW)

( * ) Notice: Subject to any disclaimer, the term of this patent is extended or adjusted under 35 U.S.C. 154(b) by 21 days.

(21) Appl. No.: 12/012,845

(22) Filed: Feb. 6, 2008

(65) Prior Publication Data

US 2008/0192883 A1 Aug. 14, 2008

(30) Foreign Application Priority Data

Feb. 9, 2007 (CN) .................... 2007 1 0073259

(51) Int. Cl.
*G11C 19/00* (2006.01)
(52) U.S. Cl. ............... 377/64; 377/68; 377/69; 377/74; 377/79
(58) Field of Classification Search ........... None
See application file for complete search history.

(56) References Cited

U.S. PATENT DOCUMENTS

| | | | |
|---|---|---|---|
| 4,939,384 A * | 7/1990 | Shikata et al. ............... 327/212 |
| 5,140,179 A * | 8/1992 | Takano ........................ 327/203 |
| 5,222,082 A | 6/1993 | Plus | |
| 5,410,583 A | 4/1995 | Weisbrod et al. | |
| 5,994,935 A * | 11/1999 | Ueda et al. ................... 327/202 |
| 6,970,530 B1 * | 11/2005 | Wang et al. .................... 377/69 |
| 7,203,264 B2 * | 4/2007 | Lo et al. ........................ 377/64 |
| 7,406,146 B2 * | 7/2008 | Yu ................................ 377/64 |
| 2004/0165692 A1 | 8/2004 | Moon et al. | |
| 2008/0101529 A1 * | 5/2008 | Tobita ........................... 377/64 |

FOREIGN PATENT DOCUMENTS

WO 2005122178 A1 12/2005

* cited by examiner

*Primary Examiner*—Tuan Lam
(74) *Attorney, Agent, or Firm*—Wei Te Chung

(57) ABSTRACT

An exemplary shift register (20) includes a plurality of shift register units (200) connected one by one. Each of the shift register units includes a clock signal input terminal (TS), a reverse clock signal input terminal (TSB), a high level signal input terminal (VH), a low level signal input terminal (VL), an output terminal (VOUT), a reverse output terminal (VOUTB), a first input terminal (VIN1), a second input terminal (VIN2), a common node (P), a first switch circuit (31) providing a high level signal to the common node, a second switch circuit (32) providing a low level signal to the common node, a third switch circuit (33) providing a clock signal to the output terminal, a fourth switch circuit (34) providing a low level signal to the output terminal, and an inverter (36) connected between the output terminal and the reverse output terminal.

18 Claims, 5 Drawing Sheets

SHIFT REGISTER WITH SIX TRANSISTORS AND LIQUID CRYSTAL DISPLAY USING THE SAME

FIELD OF THE INVENTION

The present invention relates to shift registers, and particularly to a shift register having six transistors and a liquid crystal display (LCD) employing the shift register.

GENERAL BACKGROUND

An LCD has the advantages of portability, low power consumption, and low radiation. Therefore, the LCD has been widely used in various portable information products, such as notebooks, personal digital assistant (PDA), video cameras, and the like.

In general, an LCD includes a gate driver and a data driver. The gate and data drivers drive thin film transistors (TFTs) of an LCD panel of the LCD to display images. Each of the gate and data drivers includes a shift register having a plurality of shift register units connected one by one. Each of the shift register units includes an input terminal and an output terminal. The input terminal of each shift register unit is connected to the output terminal of a pre-stage shift register unit. The output terminal of each shift register unit is connected to the input terminal of a rear-stage shift register unit.

FIG. 5 is a circuit diagram of a shift register unit of a conventional shift register. The shift register unit 100 includes an input terminal (not labeled), a first clock reversed phase circuit 110, a switch circuit 120, a second clock reversed phase circuit 130, and an output terminal (not labeled).

The first clock reversed phase circuit 110 includes a first transistor M1, a second transistor M2, a third transistor M3, and a fourth transistor M4. The first to fourth transistors M1~M4 are P-channel metal-oxide-semiconductor (PMOS) transistors. A gate electrode of the first transistor M1 is the input terminal of the shift register unit 100 and is used to receive an input signal VS (i.e. an output signal of the output terminal of a pre-stage shift register unit). A source electrode of the first transistor M1 is used to receive a high level signal VDD. A drain electrode of the first transistor M1 is connected to a source electrode of the second transistor M2. A gate electrode and a drain electrode of the second transistor M2 are all used to receive a low level signal VSS. A gate electrode of the third transistor M3 and a gate electrode of the fourth transistor M4 are all used to receive a reverse clock signal CKB. A source electrode of the third transistor M3 is connected to the drain electrode of the first transistor M1. A source electrode of the fourth transistor M4 is connected to the gate electrode of the first transistor M1.

The switch circuit 120 includes a fifth transistor M5 and a sixth transistor M6. The fifth and sixth transistors M5, M6 are PMOS transistors. A gate electrode of the fifth transistor M5 is connected to a drain electrode of the third transistor M3. A source electrode of the fifth transistor M5 is used to receive the high level signal VDD. A drain electrode of the fifth transistor M5 is connected to a source electrode of the sixth transistor M6. A gate electrode of the sixth transistor M6 is connected to a drain electrode of the fourth transistor M4. A drain electrode of the sixth transistor M6 is used to receive the low level signal VSS. The source electrode of the sixth transistor M6 is the output terminal of the shift register unit 100 and is used to output an output signal VO.

The second clock reversed phase circuit 130 includes a seventh transistor M7, an eighth transistor M8, a ninth transistor M9, and a tenth transistor M10. The seventh to tenth transistors M7~M10 are PMOS transistors. A gate electrode of the seventh transistor M7 is connected to the output terminal. A source electrode of the seventh transistor M7 is used to receive the high level signal VDD. A drain electrode of the seventh transistor M7 is connected to a source electrode of the eighth transistor M8. a drain electrode and a gate electrode of the eighth transistor M8 are all used to receive the low level signal VSS. A source electrode of the ninth transistor M9 is connected to the drain electrode of the third transistor M3. A gate electrode of the ninth transistor M9 is used to receive a clock signal CK. A drain electrode of the ninth transistor M9 is connected to the drain electrode of the seventh transistor M7. A gate electrode of the tenth transistor M10 is used to receive the clock signal CK. A source electrode of the tenth transistor M10 is connected to the drain electrode of the fourth transistor M4. A drain electrode of the tenth transistor M10 is connected to the output terminal.

FIG. 6 is a sequence waveform diagram of pulse signals of the shift register unit of FIG. 5. During a first period T1, the reverse clock signal CKB is a high level, thus the third transistor M3 and the fourth transistor M4 are turned off. The clock signal CK is a low level, thus the ninth transistor M9 and the tenth transistor M10 are turned on. The output signal VO is a high level, thus the output signal VO turns off the sixth transistor M6 via the actived tenth transistor M10. The gate electrode of the eighth transistor M8 receives the low level signal VSS, thus the eighth transistor M8 is turned on. The low level signal VSS turns on the fifth transistor M5 via the actived eighth transistor M8 and the actived ninth transistor M9. The output terminal of the shift register unit 100 receives the high level signal VDD via the actived fifth transistor M5. That is, the output signal VO is high level during the first period T1.

During a second period T2, the reversed clock signal CKB is a low level, thus the third transistor M3 and the fourth transistor M4 are turned on. The clock signal CK is a high level, thus the ninth transistor M9 and the tenth transistor M10 are turned off. The input signal VS is a low level, thus the first transistor M1 is turned on. The high level signal VDD turns off the fifth transistor M5 via the actived first transistor M1 and the actived third transistor M3. The input signal VS turns on the sixth transistor M6 via the actived fourth transistor M4. The output terminal of the shift register unit 100 receives the low level signal VSS via the actived sixth transistor M6. That is, the output signal VO is low level during the second period T2.

During a third period T3, the reversed clock signal CKB is a high level, thus the third transistor M3 and the fourth transistor M4 are turned off. The clock signal CK is a low level, thus the ninth transistor M9 and the tenth transistor M10 are turned on. The output signal VO is a low level, thus the output signal VO turns on the seventh transistor M7 and the sixth transistor M6 via the actived tenth transistor M10. The high level signal VDD turns off the fifth transistor M5 via the actived seventh transistor M7 and the actived ninth transistor M9. The output terminal of the shift register unit 100 receives the low level signal VSS via the actived sixth transistor M6. That is, the output signal VO is low level during the third period T3.

During a fourth period T4, the reversed clock signal CKB is a low level, thus the third transistor M3 and the fourth transistor M4 are turned on. The clock signal CK is a high level, thus the ninth transistor M9 and the tenth transistor M10 are turned off. The input signal VS is high level, thus the first transistor M1 is turned off. The input signal VS turns off the sixth transistor M6 via the actived fourth transistor M4. The gate electrode of the second transistor M2 receives the low level signal VSS, thus the second transistor M2 is turned on. The low level signal VSS turns on the fifth transistor M5 via the actived second transistor M2 and the actived third transistor M3. The output terminal of the shift register unit 100 receives the high level signal VDD via the actived fifth transistor M5. That is, the output signal VO is high level during the fourth period T4.

Each of the shift register units includes ten transistors and the circuit wiring is complex, thus the circuit structure of the shift register is complex. When the gate driver or the data driver of the LCD employs the shift register, it is liable to generate noise interference in the gate driver or the data driver.

What is needed, therefore, is a shift register and an LCD employing the shift register that can overcome the above-described deficiencies.

SUMMARY

A shift register includes a plurality of shift register units. Each shift register unit includes: a first switch circuit controlled by a first input terminal of the shift register unit and configured for providing a high level signal to a common node of the shift register unit; a second switch circuit controlled by the common node, a second input terminal of the shift register unit, and a reverse clock signal, and configured for providing a low level signal to the common node; a third switch circuit controlled by the common node and configured for providing a clock signal to an output terminal of the shift register unit; a fourth switch circuit controlled by a reverse clock signal and configured for providing a low level signal to the output terminal; and an inverter connected between the output terminal and a reverse output terminal of the shift register unit.

A shift register includes a plurality of shift register units connected one by one. Each of the shift register units includes a clock signal input terminal configured for receiving a clock signal, a reverse clock signal input terminal configured for receiving a reverse clock signal, a high level signal input terminal configured for receiving a high level signal, a low level signal input terminal configured for receiving a low level signal, a first input terminal configured for receiving a first input signal, a second input terminal configured for receiving a second input signal, and an output terminal configured for outputting an output signal. The output signal is low level when the clock signal is low level, the reverse clock signal is high level, the first input signal is high level, and the second input signal is low level. The output signal is high level when the clock signal is high level, the reverse clock signal is low level, the first input signal is low level, and the second input signal is high level. The output signal is low level when the clock signal is low level, the reverse clock signal is high level, the first input signal is low level, and the second input signal is high level. The output signal is low level when the clock signal is low level, the reverse clock signal is low level, the first input signal is low level, and the second input signal is high level.

A liquid crystal display includes a liquid crystal panel and a driver circuit configured for driving the liquid crystal panel. The driver circuit includes a shift register. The shift register includes a plurality of shift register units. Each shift register unit includes: a first switch circuit controlled by a first input terminal of the shift register unit and configured for providing a high level signal to a common node of the shift register unit; a second switch circuit controlled by the common node, a second input terminal of the shift register unit, and a reverse clock signal, and configured for providing a low level signal to the common node; a third switch circuit controlled by the common node and configured for providing a clock signal to an output terminal of the shift register unit; a fourth switch circuit controlled by a reverse clock signal and configured for providing a low level signal to the output terminal; and an inverter connected between the output terminal and a reverse output terminal of the shift register unit.

Other novel features and advantages will become more apparent from the following detailed description when taken in conjunction with the accompanying drawings.

DETAILED DESCRIPTION OF PREFERRED EMBODIMENTS

Reference will now be made to the drawings to describe the preferred and exemplary embodiments in detail.

Figure 1:
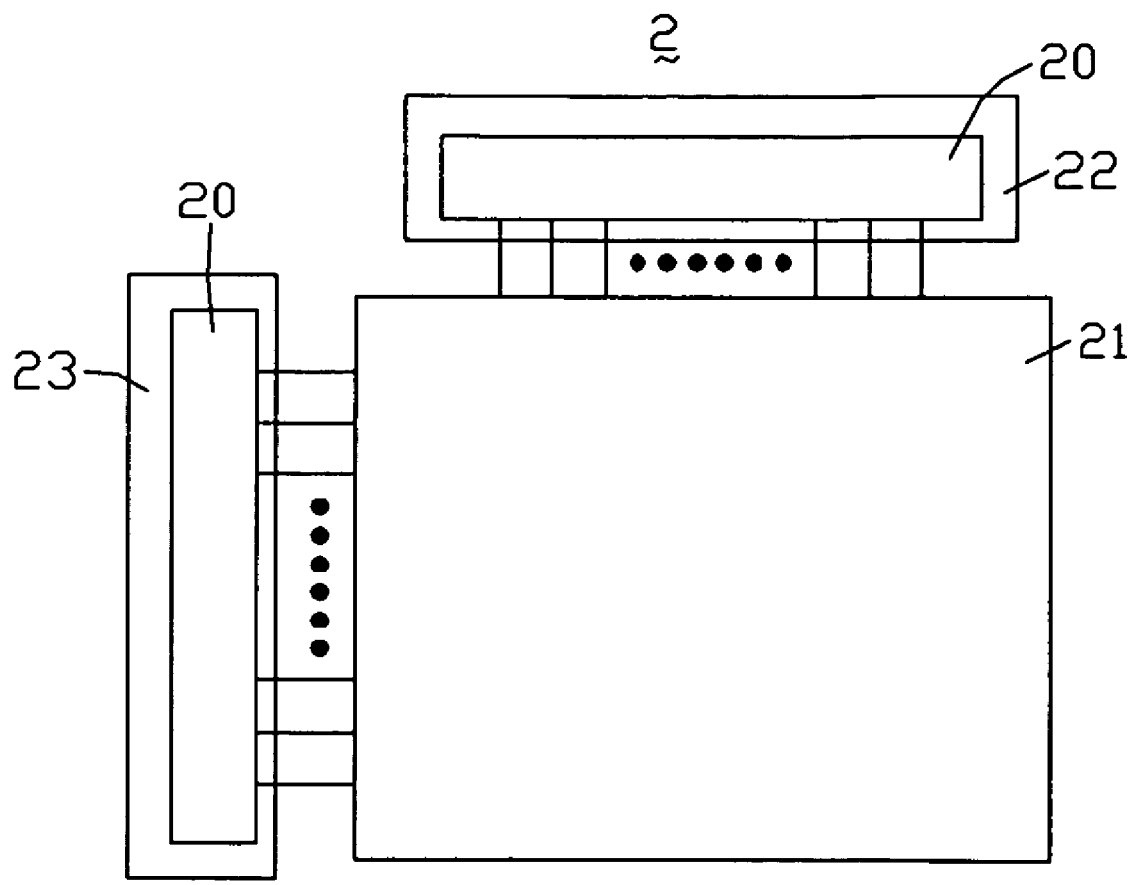
FIG. 1 is a schematic, abbreviated diagram of certain components of an LCD according to an exemplary embodiment of the present invention, the LCD including a shift register.

FIG. 1 is a schematic, abbreviated diagram of certain components of an LCD according to an exemplary embodiment of the present invention. The LCD 2 includes a liquid crystal panel 21, a source driver 22 connected to the liquid crystal panel 21 via a plurality of data lines (not labeled), and a gate driver 23 connected to the liquid crystal panel 21 via a plurality of gate lines (not labeled). The liquid crystal panel 21 includes a plurality of thin film transistors (TFTs). Each of the data and gate drivers 22, 23 includes a shift register 20. The shift register 20 provides shift signals to the data driver 22 or the gate driver 23. The gate driver 23 outputs high level signals or low level signals to turn on or turn off the TFTs. The data driver 23 outputs data signals to the liquid crystal panel 21 via the actived TFTs to display images.

Figure 2:
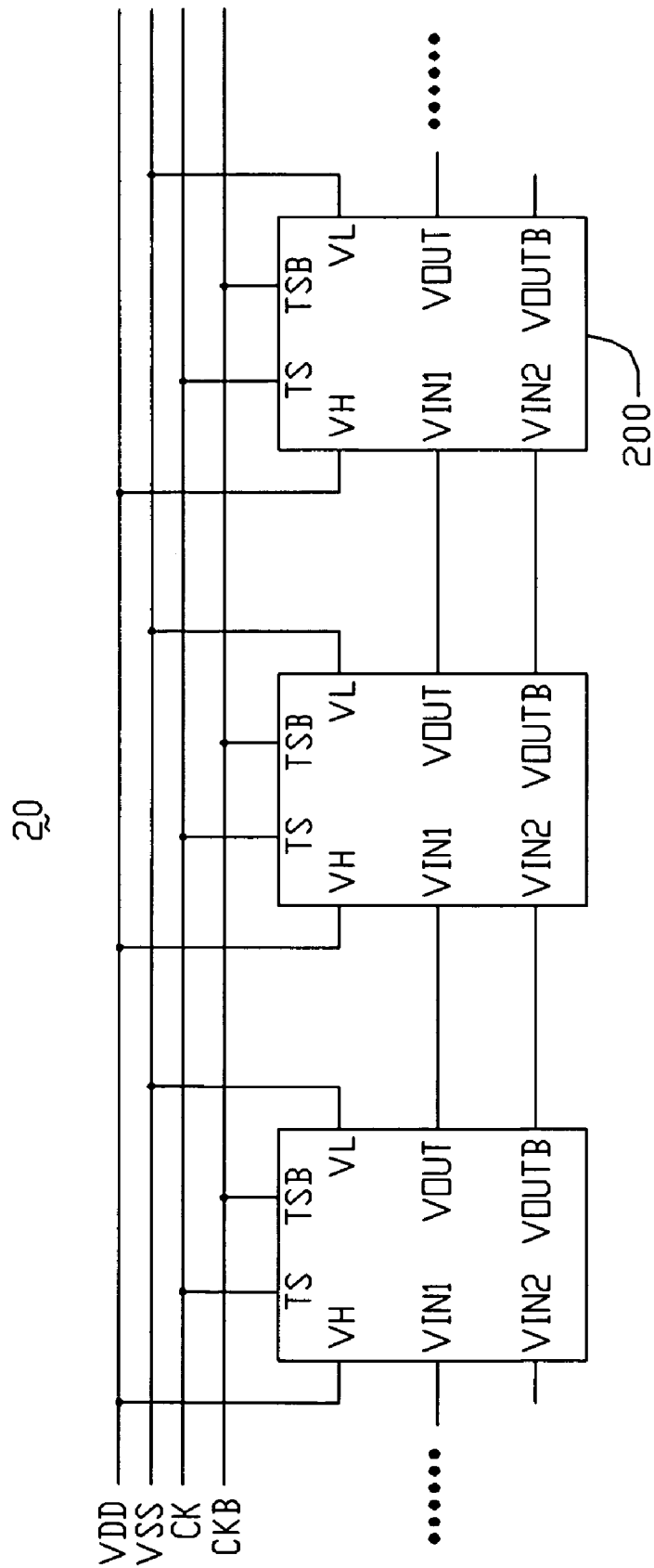
FIG. 2 is an abbreviated block circuit diagram of the shift register of FIG. 1, the shift register including a plurality of shift register units connected one by one.

FIG. 2 is an abbreviated block circuit diagram of the shift register 20 of FIG. 1. The shift register 20 includes a plurality of shift register units 200 connected one by one. All of the shift register units 200 have similar structures. Each of the shift register units 200 includes a clock signal input terminal TS for receiving a clock signal CK, a reverse clock signal input terminal TSB for receiving a reverse clock signal CKB, a high level signal input terminal VH for receiving a high level signal VDD, a low level signal input terminal VL for receiving a low level signal VSS, a first input terminal VIN1, a second input terminal VIN2, an output terminal VOUT, and a reverse output terminal VOUTB. The first input terminal VIN1 of each shift register unit 200 is connected to the output terminal of a pre-stage shift register unit. The second input terminal VIN2 of each shift register unit 200 is connected to the reverse output terminal VOUTB of the pre-stage shift register unit. The output terminal VOUT of each shift register unit 200 is connected to the first input terminal VIN1 of a rear-stage shift register unit. The reverse output terminal VOUTB of each shift register unit 200 is connected to the second input terminal VIN2 of the rear-stage shift register unit.

Figure 3:
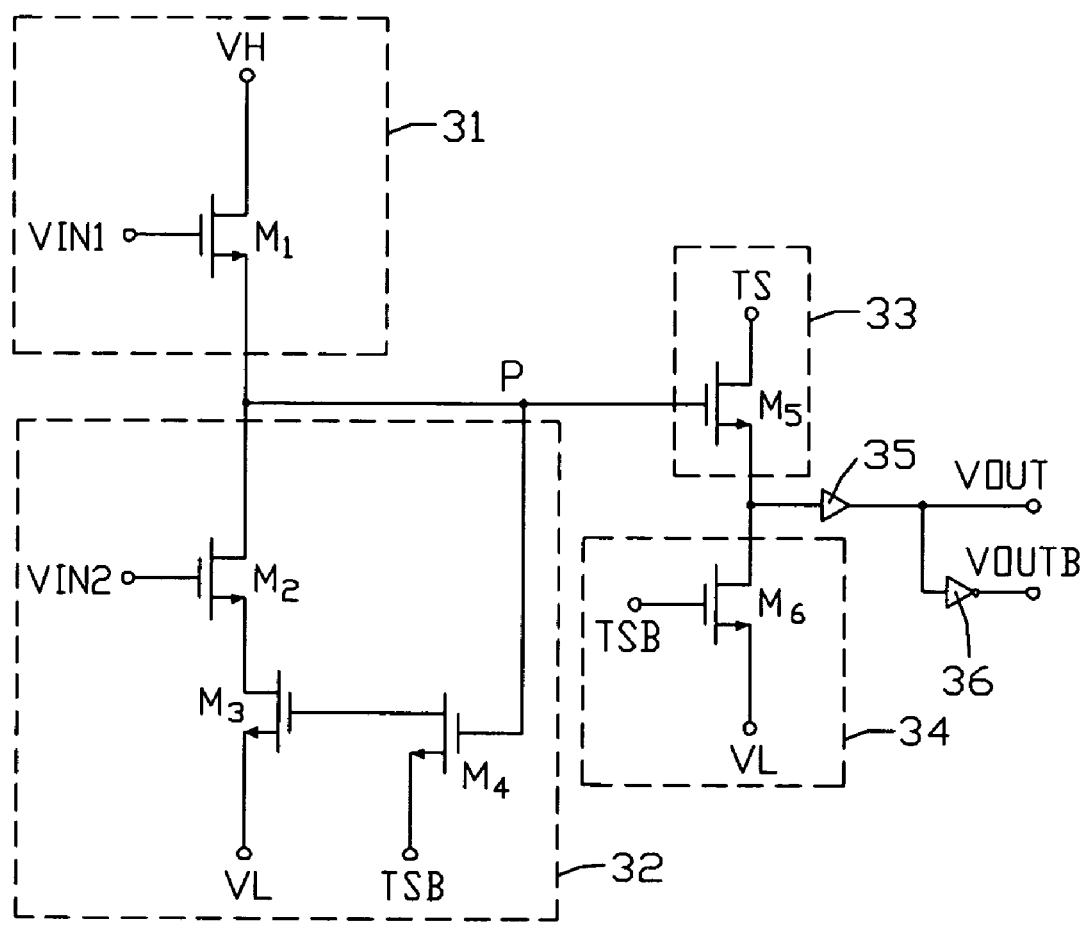
FIG. 3 is a circuit diagram of one of the shift register units of FIG. 2.

FIG. 3 is a circuit diagram of one of the shift register units 200 of FIG. 2. The shift register unit 200 includes a first switch circuit 31, a second switch circuit 32, a third switch circuit 33, a fourth switch circuit 34, a buffer 35, an inverter 36, and a commun node P.

The first switch circuit 31 can be a first transistor M1. A gate electrode of the first transistor M1 is connected to the first input terminal VIN1. A drain electrode of the first transistor M1 is connected to the high level signal input terminal VH. A source electrode of the first transistor M1 is connected to the common node P.

The second switch circuit 32 includes a second transistor M2, a third transistor M3, and a fourth transistor M4. A gate electrode of the second transistor M2 is connected to the second input terminal VIN2. A drain electrode of the second transistor M2 is connected to the common node P. A source electrode of the second transistor M2 is connected to a drain electrode of the third transistor M3. A source electrode of the third transistor M3 is connected to the low level signal input terminal VL. A gate electrode of the third transistor M3 is connected to a drain electrode of the fourth transistor M4. A source electrode of the fourth transistor M4 is connected to the reverse clock signal input terminal TSB. A gate electrode of the fourth transistor M4 is connected to the common node P.

The third switch circuit 33 can be a fifth transistor M5. A drain electrode of the fifth transistor M5 is connected to the clock signal input terminal TS. A gate electrode of the fifth transistor M5 is connected to the common node P. A source electrode of the fifth transistor M5 is connected to the buffer 35.

The fourth switch circuit 34 can be a sixth transistor M6. A drain electrode of the sixth transistor M6 is connected to the buffer 35. A gate electrode of the sixth transistor M6 is connected to the reverse clock signal input terminal TSB. A source electrode of the sixth transistor M6 is connected to the low level signal input terminal VL.

The output terminal VOUT is connected to the buffer 35. The reverse output terminal VOUTB is connected to the output terminal VOUT via the inverter 36.

The first to sixth transistors M1~M6 are N-channel metal-oxide-semiconductor (NMOS) transistors. The buffer 35 includes two inverters (not shown) connected in series. The buffer 35 is configured for reducing distortion of the output waveform of the shift register unit 200.

Figure 4:
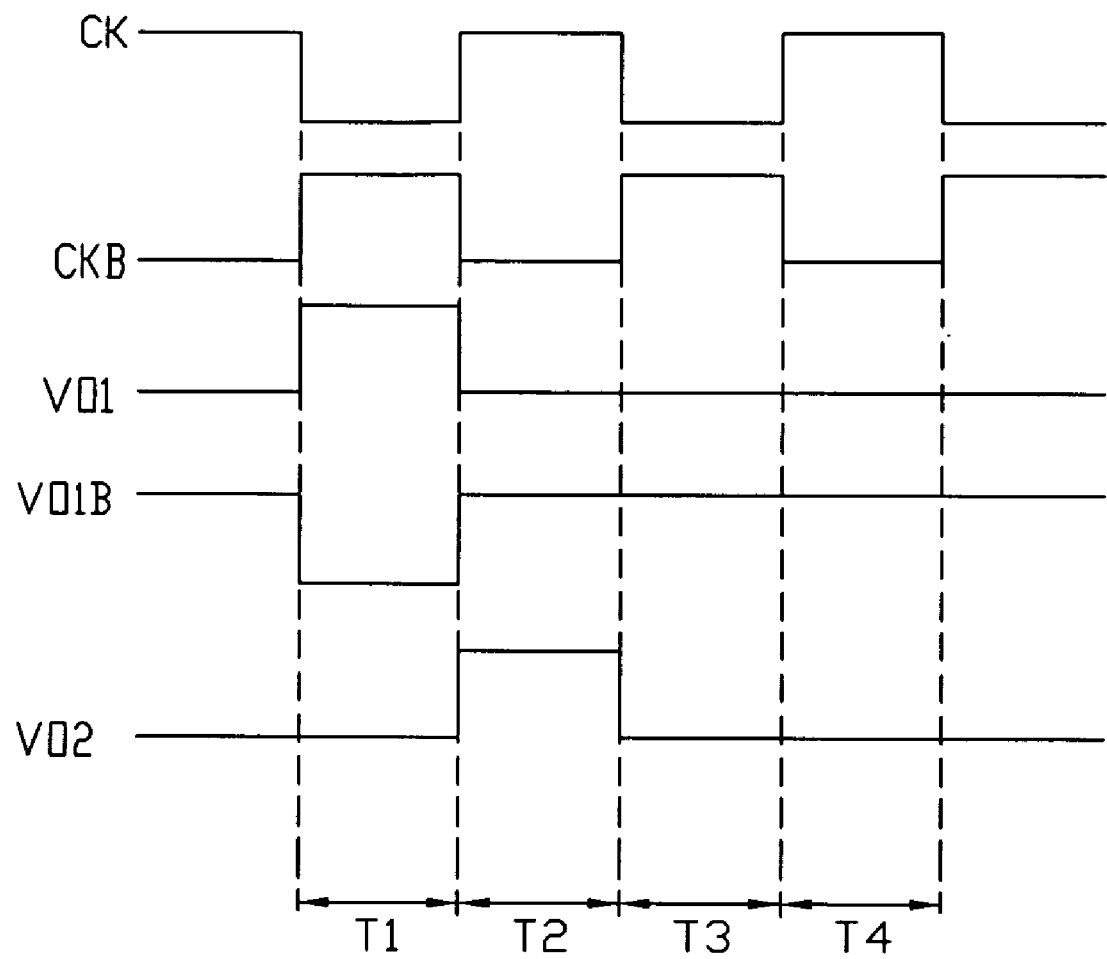
FIG. 4 is a sequence waveform diagram of pulse signals of the shift register of FIG. 2.
Figure 5:
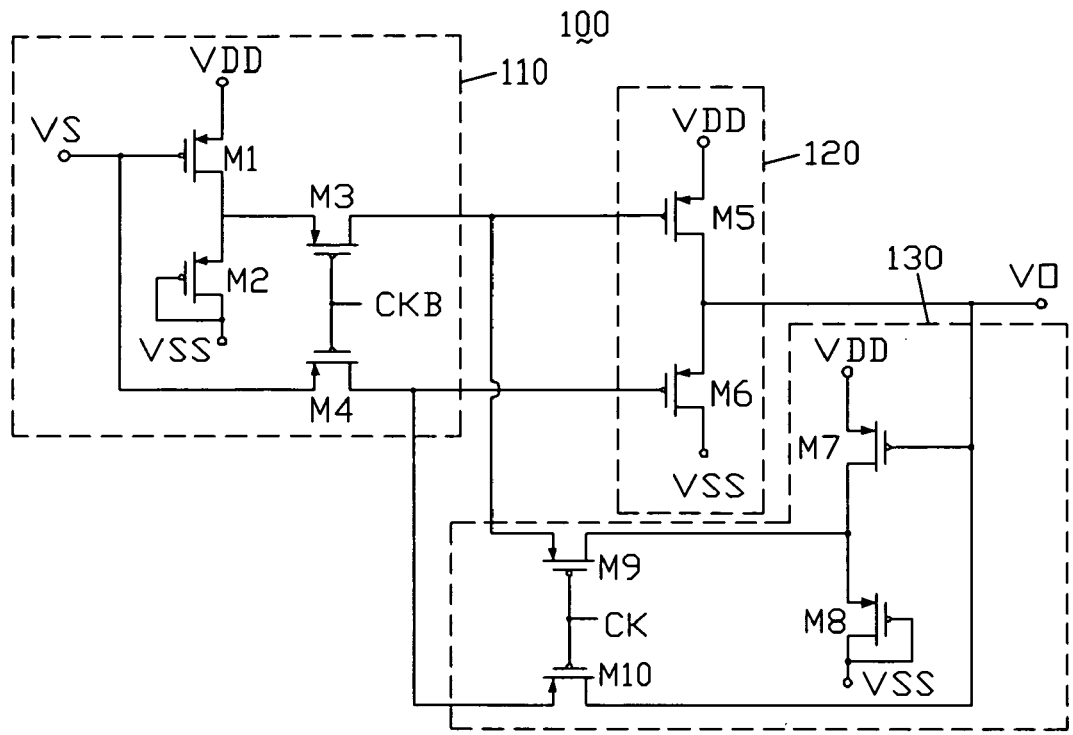
FIG. 5 is a circuit diagram of a shift register unit of a conventional shift register.
Figure 6:
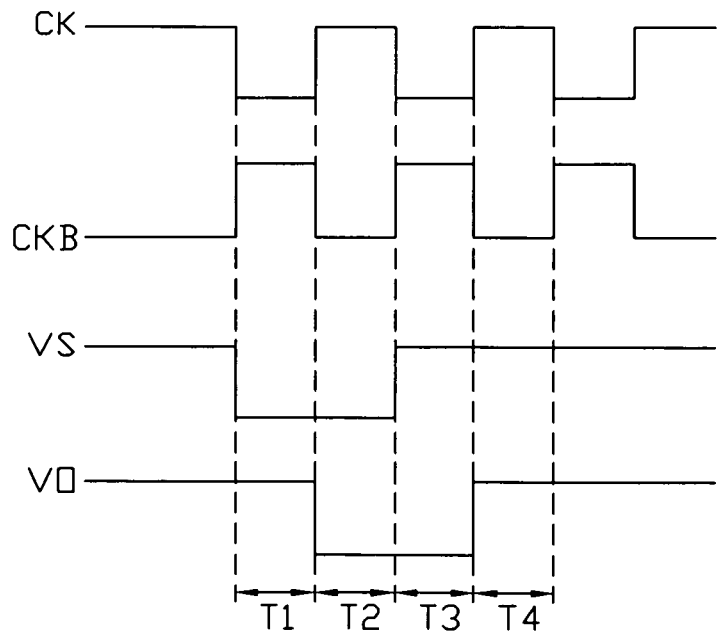
FIG. 6 is a sequence waveform diagram of pulse signals of the shift register of FIG. 5.

FIG. 4 is a sequence waveform diagram of pulse signals of the shift register 20 of FIG. 2. VO2 represents an output signal of the output terminal VOUT of any shift register unit. VO1 and VO1B respectively represent an output signal of the output terminal VOUT and a reverse output signal of the reverse output terminal VOUTB of pre-stage shift register unit.

During a first period T1, the output signal VO1 is a high level, thus the first transistor M1 is turned on. The common node P is pulled in a high level state via the actived first transistor M1. The fifth transistor M5 is turned on. The reverse output signal VO1B is a low level, thus the second transistor M2 is turned off. The reverse clock signal CKB is a high level, thus the sixth transistor M6 is turned on. The clock signal CK is a low level, thus the buffer 35 receives a low level signal. The output signal VO2 is low level.

During a second period T2, the output signal VO1 is a low level, thus the first transistor M1 is turned off. The common node P keeps in the high level state, thus the fourth transistor M4 and the fifth transistor M5 are turned on. The reverse clock signal CKB is a low level, thus the reverse clock signal CKB turns off the third transistor M3 via the actived fourth transistor M4 and the sixth transistor M6. The clock signal CK is a high level, thus the buffer 206 receives a high level signal. The output signal VO2 is high level.

During a third period T3, the output signal VO1 is a low level, thus the first transistor M1 is turned off. The fourth transistor M4 keeps the actived state. The reverse clock signal CKB is a high level, thus the reverse clock signal CKB turns on the third transistor M3 via the actived fourth transistor M4. The reverse output signal VO1B is a high level, thus the second transistor M2 is turned on. The common node P is pulled in a low level state via the actived second transistor M2 and the actived third transistor M3. The fifth transistor M5 is turned off. The reverse clock signal CKB also turns on the sixth transistor M6. The buffer 35 receives the low level signal VSS via the actived sixth transistor M6. The output signal VO2 is low level.

During a fourth period T4, the output signal VO1 is a low level, thus the first transistor M1 is turned off. The common node P keeps in the low level state, thus the fourth transistor M4 and the fifth transistor M5 are turned off. The reverse clock signal CKB is a low level, thus the sixth transistor M6 is turned off. The output signal VO2 keeps in low level state.

The shift register unit 200 includes the first to sixth transistors M1~M6. That is, the shift register 20 utilizes fewer transistors to enable each of the shift register units 200 to function. The circuit wiring is correspondingly simple, thus the circuit structure of the shift register 20 is simple.

Furthermore, when the gate driver 23 or the data driver 22 of the LCD 2 employs the shift register 20, the noise interference in the gate driver 23 or the data driver 22 is effectively reduced or even eliminated.

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shift register, comprising a plurality of shift register units, each shift register unit comprising:
    a first switch circuit controlled by a first input terminal of the shift register unit and configured for providing a high level signal to a common node of the shift register unit;
    a second switch circuit controlled by the common node, a second input terminal of the shift register unit, and a reverse clock signal, and configured for providing a low level signal to the common node;
    a third switch circuit controlled by the common node and configured for providing a clock signal to an output terminal of the shift register unit;
    a fourth switch circuit controlled by the reverse clock signal and configured for providing the low level signal to the output terminal; and
    an inverter connected between the output terminal and a reverse output terminal of the shift register unit.

2. The shift register as claimed in claim 1, further comprising a clock signal input terminal configured for receiving the clock signal, a reverse clock signal input terminal configured for receiving the reverse clock signal, a high level signal input terminal configured for receiving the high level signal, and a low level signal input terminal configured for receiving the low level signal.

3. The shift register as claimed in claim 2, wherein the first switch circuit is a transistor, the transistor comprises a gate electrode connected to the first input terminal, a drain electrode connected to the high level signal input terminal, and a source electrode connected to the common node.

4. The shift register as claimed in claim 3, wherein the transistor is an N-channel metal-oxide-semiconductor transistor.

5. The shift register as claimed in claim 2, wherein the second switch circuit comprises a first transistor, a second transistor, and a third transistor; the first transistor comprises a gate electrode connected to the second input terminal, a drain electrode connected to the common node, and a source electrode; the second transistor comprises a gate electrode, a drain electrode connected to the source electrode of the first transistor, and a source electrode connected to the low level signal input terminal; the third transistor comprises a gate electrode connected to the common node, a drain electrode connected to the gate electrode of the second transistor, and a source electrode connected to the reverse clock signal input terminal.

6. The shift register as claimed in claim 5, wherein the first transistor, the second transistor, and the third transistor are N-channel metal-oxide-semiconductor transistors.

7. The shift register as claimed in claim 2, wherein the third switch circuit is a transistor, the transistor comprises a gate electrode connected to the common node, a drain electrode connected to the first clock signal input terminal, and a source electrode connected to the output terminal.

8. The shift register as claimed in claim 7, wherein the transistor is an N-channel metal-oxide-semiconductor transistor.

9. The shift register as claimed in claim 2, wherein the fourth switch circuit is a transistor, the transistor comprises a gate electrode connected to the reverse clock signal input terminal, a drain electrode connected to the output terminal, and a source electrode connected to the low level signal input terminal.

10. The shift register as claimed in claim 9, wherein the transistor is an N-channel metal-oxide-semiconductor transistor.

11. The shift register as claimed in claim 2, further comprising a buffer connected between the third switch circuit and the output terminal.

12. The shift register as claimed in claim 11, wherein the buffer comprises two inverters connected in series.

13. A liquid crystal display, comprising a liquid crystal panel and a driver circuit configured for driving the liquid crystal panel; the driver circuit comprising a shift register; the shift register comprising a plurality of shift register units; each shift register unit comprising:
   a first switch circuit controlled by a first input terminal of the shift register unit and configured for providing a high level signal to a common node of the shift register unit;
   a second switch circuit controlled by the common node, a second input terminal of the shift register unit, and a reverse clock signal, and configured for providing a low level signal to the common node;
   a third switch circuit controlled by the common node and configured for providing a clock signal to an output terminal of the shift register unit;
   a fourth switch circuit controlled by the reverse clock signal and configured for providing the low level signal to the output terminal; and
   an inverter connected between the output terminal and a reverse output terminal of the shift register unit.

14. A shift register, comprising a plurality of shift register units connected one by one, each shift register unit comprising:
   a first input terminal configured for receiving a first input signal;
   a second input terminal configured for receiving a second input signal;
   an output terminal configured for outputting an output signal;
   a reverse output terminal configured for outputting a reverse output signal;
   a clock signal input terminal configured for receiving a clock signal;
   a reverse clock signal input terminal configured for receiving a reverse clock signal;
   a high level signal input terminal configured for receiving a high level signal;
   a low level signal input terminal configured for receiving a low level signal;
   a first switch circuit controlled by the first input terminal of the shift register unit and configured for providing the high level signal to a common node of the shift register unit;
   a second switch circuit controlled by the common node, the second input terminal of the shift register unit, and the reverse clock signal, and configured for providing the low level signal to the common node;
   a third switch circuit controlled by the common node and configured for providing the clock signal to the output terminal of the shift register unit, and
   a fourth switch circuit controlled by the reverse clock signal and configured for providing the low level signal to the output terminal;
   wherein the output terminal and the reverse output terminal of each shift register unit are respectively connected to the first and the second input terminals of a succedent shift register unit, and the output signal and the reverse output signal output from each shift register unit are provided to the succedent shift register unit as the first and the second input signals thereof.

15. The shift register as claimed in claim 14, wherein the first switch circuit is a first transistor, the first transistor comprises a gate electrode connected to the first input terminal, a drain electrode connected to the high level signal input terminal, and a source electrode connected to the common node.

16. The shift register as claimed in claim 15, wherein the second switch circuit comprises a second transistor, a third transistor, and a fourth transistor; the second transistor comprises a gate electrode connected to the second input terminal, a drain electrode connected to the common node, and a source electrode; the third transistor comprises a gate electrode, a drain electrode connected to the source electrode of the second transistor, and a source electrode connected to the low level signal input terminal; the fourth transistor comprises a gate electrode connected to the common node, a drain electrode connected to the gate electrode of the third transistor, and a source electrode connected to the reverse clock signal input terminal.

17. The shift register as claimed in claim 16, wherein the third switch circuit is a fifth transistor, the fifth transistor comprises a gate electrode connected to the common node, a drain electrode connected to the first clock signal input terminal, and a source electrode connected to the output terminal.

18. The shift register as claimed in claim 17, wherein the fourth switch circuit is a sixth transistor, the sixth transistor comprises a gate electrode connected to the reverse clock signal input terminal, a drain electrode connected to the output terminal, and a source electrode connected to the low level signal input terminal.

* * * * *